United States Patent [19]

Dev Tyagi

[11] Patent Number: 4,906,607
[45] Date of Patent: Mar. 6, 1990

[54] SENSOR AND METHOD FOR INDICATING THE PRESENCE OF A LOW MAGNETIC FIELD USING HIGH CRITICAL TEMPERATURE SUPERCONDUCTOR CERAMIC MATERIAL TO ABSORB ELECTROMAGNETIC ENERGY

[75] Inventor: Som Dev Tyagi, Wilmington, Del.
[73] Assignee: Drexel University, Philadelphia, Pa.
[21] Appl. No.: 178,160
[22] Filed: Apr. 6, 1988
[51] Int. Cl.[4] ............................................ G01R 33/035
[52] U.S. Cl. ...................................... 505/1; 324/248; 324/250; 324/345; 505/701
[58] Field of Search ................... 324/58.5 B, 248, 250, 324/345; 505/845, 846, 1

[56] References Cited

U.S. PATENT DOCUMENTS

| | | | |
|---|---|---|---|
| 2,597,149 | 5/1952 | Kahan | 324/250 |
| 3,090,003 | 5/1963 | Rempel et al. | 324/58.5 B X |
| 3,470,461 | 9/1969 | Morse | 324/248 |

FOREIGN PATENT DOCUMENTS

| | | | |
|---|---|---|---|
| 0090185 | 5/1983 | Japan | 324/250 |
| 0117167 | 6/1985 | Japan | 324/248 |

Primary Examiner—Gerard R. Strecker
Attorney, Agent, or Firm—Panitch Schwarze Jacobs and Nadel

[57] ABSTRACT

A sensor and method for indicating the presence of a low magnetic field using high critical temperature superconductor ceramic material is comprised of a sensing element consisting essentially of the high critical temperature superconductor ceramic material without the need for further processing. The sensing element is cooled to a temperature below the critical temperature of the superconductor material, whereby the sensing element becomes superconducting. Electromagnetic energy is applied to the sensing element, a first portion of the energy being absorbed by the sensing element. The amount of the energy absorbed by the sensing element is detected. The sensing element is modulated to provide a reference signal and is biased to a predetermined absorption reference value, whereby a magnetic field of about $10^{-10}$ tesla or less near the sensing element results in a change in the absorption of the magnetic energy by the sensing element, the change being detected to indicate the presence of the magnetic field.

20 Claims, 1 Drawing Sheet

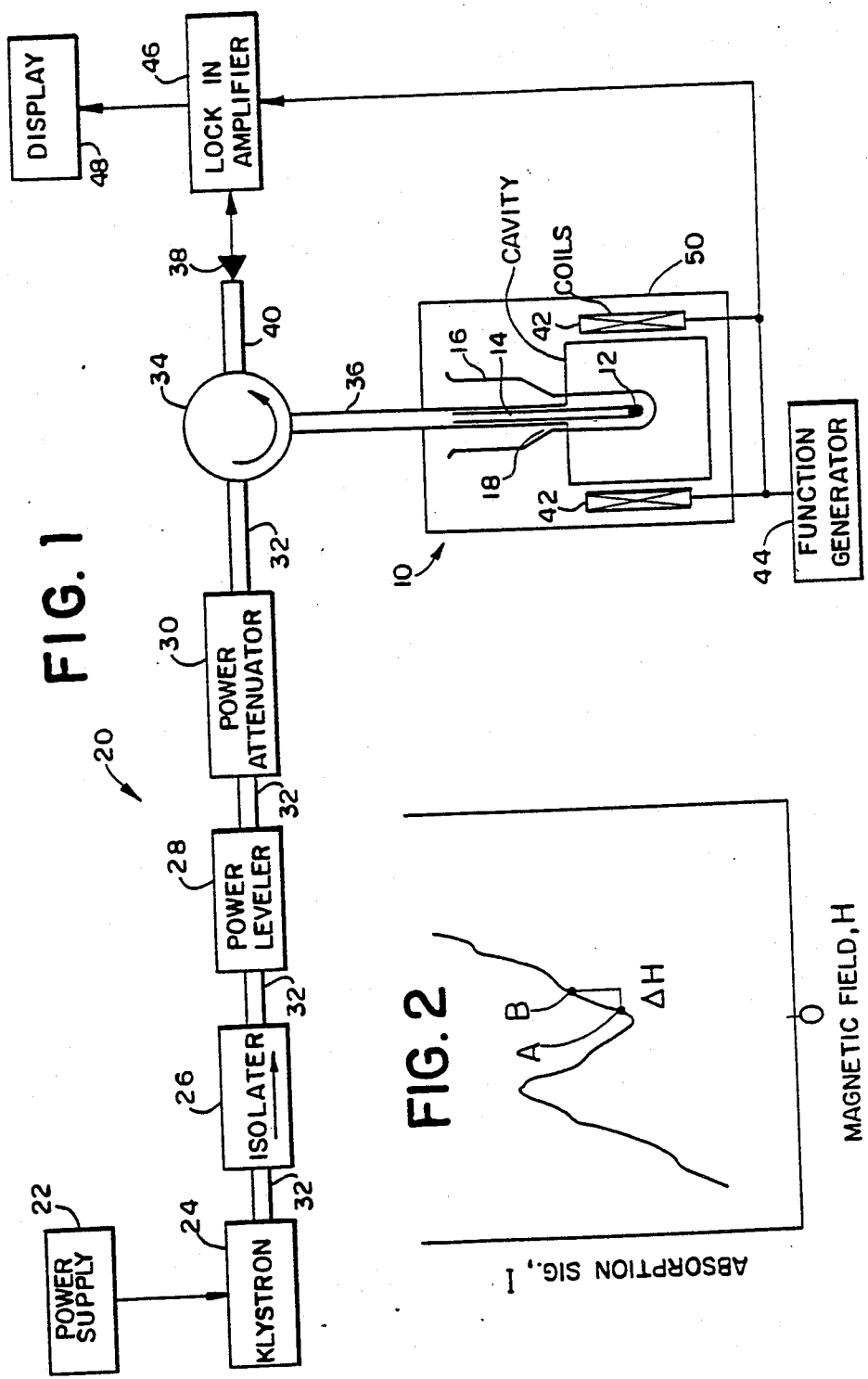

SENSOR AND METHOD FOR INDICATING THE PRESENCE OF A LOW MAGNETIC FIELD USING HIGH CRITICAL TEMPERATURE SUPERCONDUCTOR CERAMIC MATERIAL TO ABSORB ELECTROMAGNETIC ENERGY

BACKGROUND OF THE INVENTION

The present invention relates generally to a sensor and a method for indicating the presence of a low magnetic field and, more particularly, to such a sensor and method for indicating the presence of a magnetic field in the range of about $10^{-10}$ tesla, utilizing a sensor consisting essentially of a high critical temperature superconductor ceramic material.

It is generally well known that superconducting materials or superconductors have a critical temperature which varies, depending upon the particular superconductor. When a superconductor is at a temperature which is higher than its critical temperature, it does not conduct electricity in an efficient manner in that some of the electrical energy is converted to heat. When the temperature of the superconductor is reduced to below its critical temperature, it becomes the most efficient conductor of electricity. In the past, only superconductors having a relatively low critical temperature (near 20° Kelvin) were generally available. Use of superconductors of this type was very limited because it was difficult and expensive to maintain the temperature of such superconductors below their critical temperatures. More recently, ceramic superconductors have been developed which have a relatively high critical temperature (about 90° Kelvin), which is above the temperature of liquid nitrogen (77° Kelvin), thereby permitting such superconductors to be inexpensively maintained below their critical temperatures using inexpensive liquid nitrogen for cooling. Such high critical temperature ceramic superconductors are practical for a wide variety of applications.

In the past, high critical temperature superconductors have been employed in connection with the detection of low magnetic fields. One such prior device, referred to as a "superconducting quantum interference device" (SQUID) uses a pellet formed of a bulk, high critical temperature superconductor. The pellet is secured to a special breaking fixture and is fractured or broken along a predetermined line in a controlled manner at a temperature substantially below its critical temperature. The fractured portions of the pellet are then brought back together to form a "crack" SQUID having one or more Josephson junctions. The pellet is then inductively coupled to a cooled, tuned circuit driven at a predetermined resonant frequency. The SQUID extracts energy from the resonant circuit when the presence of a magnetic field drives the Josephson junction into a dissipative state. Other prior art devices employ a thin film of the superconducting material to form a similar SQUID.

While the prior art SQUID-type devices are adequate for detecting the presence of low magnetic fields, the special processes necessary for forming either the crack SQUID pellet or the thin film SQUID are time consuming and expensive and require reasonably sophisticated and expensive processing equipment. In addition, the SQUID pellet and/or thin film are not very stable and have a tendency to degrade rapidly after exposure to the atmosphere and/or after a relatively small number of thermal cycles.

The present invention overcomes many of the problems and drawbacks associated with such prior art low magnetic field detection devices by providing a sensor having a sensing element consisting essentially of a sample or chunk of a high critical temperature superconductor ceramic material without the need for fracturing, formation into a thin film or any further forming, processing or the like. Alternatively, the sensing element could be formed of high critical temperature superconducting ceramic material in a powder form which, if desired, may be embedded in a nonmagnetic resin epoxy formed into a desired shape or structure, again, without fracturing, thin film formation or any other processing.

SUMMARY OF THE INVENTION

Briefly stated, the present invention comprises a sensor used with a source of electromagnetic energy, preferably radio frequency or microwave energy, for indicating the presence of a low magnetic field with a sensitivity of at least $10^{-10}$ tesla. The sensor comprises a sensing element consisting essentially of a high critical temperature superconductor ceramic material in either solid or powder form without the need for further processing. Means are provided for cooling the sensing element below the critical temperature of the superconducting material, whereby the sensing element becomes superconducting. Means are provided for applying the electromagnetic energy from the source to the sensing element, a first portion of the applied energy being absorbed by the sensing element. Detecting means are provided for detecting the amount of the energy absorbed by the sensing element. Means are included for modulating the sensing element to provide a reference signal for phase-sensitive detection and for biasing the electromagnetic energy absorption characteristics of the sensing element to a predetermined absorption reference value, whereby a low magnetic field of about $10^{-10}$ tesla or less near the sensing element results in a change in the absorption of the electromagnetic energy by the sensing element, the change being detected by the detecting means to indicate the presence of the magnetic field. The present invention also comprises a corresponding method.

BRIEF DESCRIPTION OF THE DRAWING

The foregoing summary, as well as the following detailed description, will be better understood when read in conjunction with the appended drawing. For the purpose of illustrating the invention, there is shown in the drawing an embodiment which is presently preferred, it being understood, however, that the invention is not limited to the precise, arrangement and instrumentalities shown. In the drawing:

FIG. 1 is a block diagram schematic representation of a sensor in accordance with the present invention; and FIG. 2 is a representation of an absorption signal of the sensor of FIG. 1.

DESCRIPTION OF PREFERRED EMBODIMENT

Referring to the drawing, there is shown in FIG. 1 a sensor, generally 10, for indicating the presence of a low magnetic field. The present invention has been successfully demonstrated and has been shown to be effective for indicating the presence of a magnetic field, with a sensitivity of $10^{-10}$ tesla. The present invention is also applicable for indicating the presence of magnetic fields with a sensitivity of better than $10^{-10}$ tesla. Of course, it should be understood that the present invention is clearly applicable for indicating the presence of magnetic fields having a strength greater than $10^{-10}$.

The sensor 10 includes a sensing element 12 consisting essentially of a high critical temperature superconductor ceramic material. In the embodiment shown, the sensing element consists of a single piece, chunk or sample of the superconductor material, which is generally irregular in shape. In the presently preferred embodiment, the sensing element 12 has a mass of approximately one milligram and, preferably, is approximately 1 millimeter in diameter. However, it will be appreciated by those skilled in the art that the present invention is not limited to a sensing element of a particular size or shape, since a sensing element of a larger or smaller size and/or a different shape performs in the same manner as described below.

Alternatively, the sensing element 12 could be comprised of superconductor material in powder form (not shown). The powder form of the superconductor material could be loose in a container or could be embedded in a non-magnetic binder, such as epoxy resin (not shown), which may be formed to any desired shape. It will, therefore, be appreciated by those skilled in the art that the particular form, size, shape, etc. of the sensing element should not be considered to be a limitation on the present invention.

In the presently preferred embodiment, the high critical temperature superconductor ceramic material of the sensing element 12 is a $Y_1Ba_2Cu_3O_y$ superconductor, commonly known as 1:2:3 superconductor. In forming such a 1:2:3 superconductor, the oxides, yttrium oxide ($Y_2O_3$), barium carbonate (BaO in the form of $BaCO_3$) and cuperic oxide (CuO) are mixed in the appropriate ratios in a ball mill and are further processed to form the bulk or powder 1:2:3 superconductor in a manner which is well known in the art. Of course, it will be appreciated by those skilled in the art that while the 1:2:3 superconductor is the presently preferred material for the sensing element 12, any other high critical temperature ceramic superconductor material could alternatively be utilized.

With the present invention, the sensing element 12 consists only of the sample of the superconductor material without any additional processing. As discussed above, in employing superconductor material in connection with a SQUID magnetometer, it was necessary to conduct substantial additional processing to the superconductor material before it could be used for detection of magnetic fields. In some cases, the additional processing involved breaking or fracturing the superconductor material and then pushing the fractured edges back together to form a Josephson junction. In other cases, the additional processing involved forming the superconductor into a thin film. In either case, the additional processing was time consuming and relatively expensive to perform. In addition, the special equipment used for the additional processing was relatively sophisticated and expensive. With the present invention no such processing is necessary, since the sensing element 12 consists of a sample of the superconductor material as originally formed.

In the present embodiment, the sensing element 12 is supported by a carrier of non-magnetic material, preferably a quartz tube 14. In the drawing, the quartz tube 14 is shown as being closed on the lower end and open on the upper end. The quartz tube 14 could alternatively be closed and/or sealed on both ends. If desired, the sensing element 12 could be encapsulated in a quartz tube with an appropriate partial pressure of oxygen to prevent or retard degradation of the superconductor material through exposure to the atmosphere over time. It should be appreciated by those skilled in the art that while an open top quartz tube 14 is presently preferred, the carrier could be formed of any other type of non-magnetic material which could be formed into any other desired shape and which may be open or sealed.

In the present embodiment, the quartz tube 14 is installed within a larger container 16 which is also formed of a non-magnetic material, preferably quartz. The container 16 is employed for holding means, such as liquid nitrogen 18, for cooling the sensing element 12 to a temperature below the critical temperature of the superconductor material (approximately 90° Kelvin), whereby the sensing element 12 becomes superconducting. Liquid nitrogen 18, which has a temperature of approximately 77° Kelvin, is the presently preferred cooling means, primarily because it is readily available, relatively easy to store and use, and relatively inexpensive. In addition, liquid nitrogen is effective in cooling the sensing element 12 to a temperature well below the critical temperature of the 1:2:3 superconductor material. It will be appreciated by those skilled in the art that any other type of cooling liquid, such as liquid helium, could alternatively be placed into the container 16 for cooling the sensing element 12. If desired, a cooling liquid could be placed into the same quartz tube 14 which holds the sensing element 12.

It will also be appreciated by those skilled in the art that any other type of cooling means or cooling method could alternatively be employed. For example, the sensing element 12 could be contained within a housing (not shown) and the entire housing could be cooled utilizing any known cooling technique sufficient to reduce the temperature of the sensing element 12 below the critical temperature of the superconductor material. Therefore, it should be understood that the present invention is not limited to a particular means or method for cooling the sensing element 12.

The sensor 10 is employed in conjunction with a source of electromagnetic energy, shown generally in FIG. 1 as 20. In the presently preferred embodiment, the electromagnetic energy is in the microwave frequency range (above 1000 megahertz), either within the X band (8–12 gigahertz) or within the K band (18–27 gigahertz). However, the frequency of the electromagnetic energy source 20 could be another frequency within the radio frequency range (10 kilohertz to 100,000 megahertz), if desired. It should be appreciated that the frequency of the electromagnetic energy employed is not a limitation on the present invention.

In the presently preferred embodiment, the source of electromagnetic energy is comprised of a commercially available spectrometer system, for example, a Varian E-12 EPR spectrometer system. The Varian E-12 system includes a power supply 22, a Klystron 24 tuned to the desired frequency and associated conditioning equipment, including an isolator 26, power leveler 28 and power attenuator 30. The various components of the E-12 spectrometer system are suitably interconnected utilizing a generally rectangular waveguide 32 of a type well known in the art. A detailed description of the structure and operation of the E-12 system is not necessary for a complete understanding of the present invention. Such information is available from the manufacturer in publication 87-125-004 (incorporated herein by reference) and in other publications.

The Varian E-12 spectrometer was selected for use as a source of electromagnetic energy in the presently preferred embodiment because of its availability to the inventor. It should be clearly understood that a similar spectrometer produced by another manufacturer or any other type of electromagnetic energy source, such as a commercially available micro stripline or the like, could alternatively be employed.

The sensor 10 further comprises means for applying electromagnetic energy from the source 20 to the sensing element 12. In the presently preferred embodiment, the applying means comprises a magic "T" or circulator 34 having one port communicating via waveguide 32 with the electromagnetic energy source 20, and having another port communicating via waveguide 36 with the sensing element 12. If desired, some other means could be employed for applying the electromagnetic energy to the sensing element 12. The end of the waveguide 36 terminates in a specimen cavity which is also a part of the commercially purchased spectrometer. In FIG. 1, the cavity is shown as the generally square box positioned between a pair of coils 42.

A first portion of the applied electromagnetic energy is absorbed by the sensing element 12 when the sensing element 12 is superconducting. Means are employed for detecting the amount of the energy absorbed by the sensing element 12. In the presently preferred embodiment, the detecting means comprises a diode detector 38 which is connected via a waveguide 40 to a third port of the circulator 34. In the presently preferred embodiment, the circulator 34 and diode detector 38, as well as the waveguide 32, 36 and 40 are components of the Varian E-12 system. As will be appreciated by those skilled in the art, the portion of the electromagnetic energy which is not absorbed by the sensing element 12 is reflected back along waveguide 36 and into the circulator 34. The reflected electromagnetic energy then passes along waveguide 40 to the detector 38 in a manner well known in the art. By comparing the reflected energy with the energy originally applied to the sensing element 12, the portion of the applied energy which is absorbed by the sensing element 12 can be determined.

The output of the diode detector 38 is connected to a lock-in amplifier 46 (also a component of the Varian E-12 system), which, in turn, is connected to a display device or display 48. FIG. 2 shows a representation of the visual image of a typical energy absorption signal (I) of the sensing element 12 (when superconducting) as a function of an applied magnetic field (H). It has been determined that exposing the sensing element 12 to a low magnetic field alters or changes the electromagnetic energy absorption characteristics of the sensing element in a manner which can be readily observed on the display 48. Placing a magnetic field near the sensing element 12 or placing the sensing element 12 near a magnetic field results in a change in the absorption characteristics of the sensing element and a corresponding change in the curve on the display 48, thus confirming the presence of the magnetic field. As discussed above, the presently preferred embodiment has been successfully employed for detecting the presence of a magnetic field of $10^{-10}$ tesla and could be used for lower or less intense fields.

The sensor 10 further includes means for biasing the electromagnetic energy absorption characteristics of the sensing element 12 to a predetermined absorption reference value. In the presently preferred embodiment, the biasing means comprises a pair of air-core coils 42, preferably Helmholtz coils, which provide a small biasing magnetic field in the range of 0 to $10^{-4}$ tesla. The same coils 42 are driven or energized by a function generator 44 to provide low frequency voltage to each of the coils 42 for modulating the sensing element 12 to provide a reference signal for phase-sensitive detection. The output from the function generator 44 is also provided to one input of the lock-in amplifier 46, so that the reference value, shown as Point A on FIG. 2, can be seen on the display 48. The display 48 could be an oscilloscope or a similar type of cathode ray tube display device, a continuously recording printer or plotter, or any other device suitable for providing a visual image of the electromagnetic energy absorption characteristics of the sensing element 12.

It may be possible to utilize the electromagnetic coils surrounding the sample cavity of the Varian E-12 spectrometer system for the biasing and/or modulating means, or separate external coils could alternatively be employed. While in the present embodiment of the invention the coils 42 function to both modulate and to bias the sensing element 12, as discussed above, separate means could be employed for each of these functions.

When the electromagnetic energy absorption characteristics of the sensing element are biased to the predetermined absorption reference value, shown as Point A on FIG. 2, a low magnetic field near the sensing element 12 results in a further change in the absorption of the electromagnetic energy by the sensing element 12. The addition of a very small magnetic field (delta H on FIG. 2) results in a dramatic change in the absorption characteristics of the energy (from point A to point B), due to the steep slope of the curve proximate the reference value (A), providing a clear visual indication of the presence of the magnetic field.

It has been determined that the sensitivity of the sensor 10 is affected by the presence of ambient or background magnetic fields. Accordingly, the present invention further includes magnetic shielding means, at least partially surrounding the sensing element 12, for shielding the sensing element 12 from spurious magnetic fields, such as ambient or background fields. In the presently preferred embodiment, the magnetic shielding is comprised of a mu metal housing, shown generally as 50. However, it will be appreciated by those skilled in the art that any other suitable type of magnetic shielding could alternatively be employed. Moreover, the magnetic shielding means, rather than surrounding just the sensing element 12, could surround and shield the entire sensor 10, including the microwave source 20. The shielding means could also surround the entire room or enclosure within which the sensor 10 is contained.

It will also be appreciated by those skilled in the art that, under certain circumstances, no such magnetic shielding means is necessary or desirable. For example, in certain field uses of the present invention, such as utilizing the invention to locate buried metal containers or the like, it is clearly not desirable to employ such magnetic shielding means.

In addition to indicating the presence of a low magnetic field, the present invention may be employed for indicating the strength of the magnetic field. By calibrating the change in the absorption characteristics of the sensing element 12 as a result of exposure to a magnetic field of a known strength (delta H), subsequent changes in the absorption characteristics of the magnetic field along the steeply sloping portion of the curve of FIG. 2 from A to B can be extrapolated to indicate the strength of an unknown magnetic field which is either stronger or weaker than the reference magnetic field.

A wide variety of uses are presently envisioned for the above-described invention. One such use is in connection with a proximity/rotation sensor for use in robotics and/or on-line control of manufacturing processes. The present invention is also well suited for the detection of magnetic anomalies, for example, conducting geomagnetic surveys to identify magnetic ore, archeological surveying, and the detection of subsurface magnetic objects, such as 55 gallon drums used for dumping toxic waste. In addition, the present invention could be utilized for the detection of land-based or underwater vehicles or equipment, such as tanks, submarines, magnetic mines, etc. The present invention is also suitable for use in conjunction with guidance systems for weapons, such as anti-tank missiles.

From the foregoing description, it can be seen that the present invention comprises a sensor and method for indicating the presence of a low magnetic field utilizing a high critical temperature superconductor sensing element. It will be recognized by those skilled in the art that changes may be made to the above-described embodiment of the invention without departing from the broad inventive concepts thereof. It is understood, therefore, that this invention is not limited to the particular embodiment disclosed, but it is intended to cover any modifications which are within the scope and spirit of the invention, as defined by the appended claims.

I claim:

1. A sensor for use with a source of electromagnetic energy for indicating the presence of a low magnetic field with a sensitivity of at least $10^{-10}$ tesla, the sensor comprising:
    a sensing element consisting essentially of a high critical temperature superconductor ceramic oxide material without the need for further processing, said critical temperature being above 77° Kelvin;
    means for cooling the sensing element to a temperature below the critical temperature of the superconductor material whereby the sensing element becomes superconducting;
    means for applying electromagnetic energy from the source to the sensing element whereby a first portion of the applied energy is absorbed by the sensing element;
    means for detecting the amount of the energy absorbed by the sensing element; and
    means modulating the sensing element for providing a reference signal for phase-sensitive detection and for biasing the electromagnetic energy absorption characteristics of the sensing element to a predetermined absorption reference value whereby a magnetic field of about $10^{-10}$ tesla or less near the sensing element results in a change in the absorption of the electromagnetic energy by the sensing element, the change being detected by the detecting means to indicate the presence of the magnetic field.

2. The sensor as recited in claim 1, wherein the sensing element consists of a single one milligram sample of high critical temperature superconductor material.

3. The sensor as recited in claim 1, wherein the sensing element consists of high critical temperature superconductor material in powder form.

4. The sensor as recited in claim 3, wherein the superconductor powder is embedded in non-magnetic epoxy resin.

5. The sensor as recited in claim 1, further including magnetic shielding means at least partially surrounding the sensing element for shielding the sensing element from spurious magnetic fields.

6. The sensor as recited in claim 5, wherein the magnetic shielding means is comprised of a mu metal housing.

7. The sensor as recited in claim 1, wherein the modulating and biasing means comprises an air core coil for creating a biasing magnetic field proximate the sensing element.

8. The sensor as recited in claim 7, wherein the magnetic field generated by the coil is in the range of $0-10^{-4}$ tesla.

9. The sensor as recited in claim 1, further including means for indicating the absorption characteristics of the sensing element and the change in the absorption characteristics of the sensing element as a result of the magnetic field to provide an indication of the strength of the magnetic field.

10. The sensor as recited in claim 1, wherein the frequency of the electromagnetic energy source is in the radio frequency range.

11. The sensor as recited in claim 1, wherein the frequency of the electromagnetic energy source is in the microwave frequency range.

12. The sensor as recited in claim 11, wherein the frequency of the microwave energy is within the X band.

13. The sensor as recited in claim 11, wherein the frequency of the microwave energy is within the K band.

14. The sensor as recited in claim 1, wherein the sensing element is supported by a carrier of non-magnetic material.

15. The sensor as recited in claim 14 wherein the carrier is a quartz tube.

16. A method for indicating the presence of a low magnetic field with a sensitivity of at least $10^-$ tesla, comprising the steps of:
    providing a sensing element consisting essentially of a high critical temperature superconductor ceramic oxide material without the need for further processing, said critical temperature being above 77° Kelvin;
    cooling the sensing element to a temperature below the critical temperature of the superconductor material, whereby the sensing element becomes superconducting;
    applying electromagnetic energy to the sensing element whereby a first portion of the energy is absorbed ,by the sensing element;
    detecting the amount of energy absorbed by the sensing element;
    modulating the sensing element to provide a reference signal for phase-sensitive detection;
    biasing the electromagnetic energy absorption characteristics of the sensing element to a predetermined absorption reference value;
    subjecting the sensing element to a magnetic field of about $10^{-10}$ or less, resulting in a change in the absorption of the electromagnetic energy by the sensing element; and detecting the change in the absorption of the energy by the sensing element to indicate the presence of the magnetic field.

17. The method as recited in claim 16 further including the step of indicating the absorption characteristics of the sensing element and the change in the absorption characteristics of the sensing element as a result of the magnetic field to provide an indication of the strength of the magnetic field.

18. The method as recited in claim 16 further including the steps of shielding the sensing element from exposure to spurious magnetic fields.

19. The method as recited in claim 16 wherein the frequency of the electromagnetic energy is in the radio frequency range.

20. The method as recited in claim 16 wherein the frequency of the electromagnetic energy is in the microwave frequency range.

* * * * *